(12) United States Patent
Park et al.

(10) Patent No.: US 8,357,596 B2
(45) Date of Patent: Jan. 22, 2013

(54) METHOD OF FORMING A POLYCRYSTALLINE SILICON LAYER AND METHOD OF MANUFACTURING THIN FILM TRANSISTOR

(75) Inventors: Seung-Kyu Park, Yongin (KR); Ki-Yong Lee, Yongin (KR); Jin-Wook Seo, Yongin (KR); Min-Jae Jeong, Yongin (KR); Yun-Mo Chung, Yongin (KR); Yong-Duck Son, Yongin (KR); Byung-Soo So, Yongin (KR); Byoung-Keon Park, Yongin (KR); Kil-Won Lee, Yongin (KR); Dong-Hyun Lee, Yongin (KR); Jong-Ryuk Park, Yongin (KR); Tak-Young Lee, Yongin (KR); Jae-Wan Jung, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/067,407

(22) Filed: May 31, 2011

(65) Prior Publication Data

US 2011/0312135 A1  Dec. 22, 2011

(30) Foreign Application Priority Data

Jun. 16, 2010 (KR) .................. 10-2010-0057111

(51) Int. Cl.
*H01L 21/20* (2006.01)
*H01L 21/336* (2006.01)
*H01L 21/331* (2006.01)

(52) U.S. Cl. ........ 438/486; 438/795; 438/308; 438/166; 257/E21.133; 257/E21.413

(58) Field of Classification Search .................. None
See application file for complete search history.

(56) References Cited

U.S. PATENT DOCUMENTS

| | | | | |
|---|---|---|---|---|
| 5,275,851 | A * | 1/1994 | Fonash et al. | 438/479 |
| 7,416,928 | B2 * | 8/2008 | Kakehata et al. | 438/166 |
| 7,419,860 | B2 * | 9/2008 | Shinagawa et al. | 438/166 |
| 7,557,020 | B2 * | 7/2009 | Shin | 438/486 |
| 7,815,734 | B2 * | 10/2010 | Park et al. | 117/90 |
| 7,989,326 | B2 * | 8/2011 | Seo et al. | 438/486 |
| 2006/0263951 | A1 | 11/2006 | Seo et al. | |

(Continued)

FOREIGN PATENT DOCUMENTS

KR  10-2002-0033373 A  5/2002

(Continued)

OTHER PUBLICATIONS

Mechanical Translation of Korean Patent Registration No. 10-0398591 to Jeon et. al.*

*Primary Examiner* — Seahvosh Nikmanesh
*Assistant Examiner* — Evern Seven
(74) *Attorney, Agent, or Firm* — Lee & Morse, P.C.

(57) ABSTRACT

A method of crystallizing a silicon layer and a method of manufacturing a TFT, the method of crystallizing a silicon layer including forming a catalyst metal layer on a substrate; forming a catalyst metal capping pattern on the catalyst metal layer; forming a second amorphous silicon layer on the catalyst metal capping pattern; and heat-treating the second amorphous silicon layer to form a polycrystalline silicon layer.

20 Claims, 9 Drawing Sheets

U.S. PATENT DOCUMENTS

| | | |
|---|---|---|
| 2007/0154623 A1 | 7/2007 | Min et al. |
| 2007/0243670 A1* | 10/2007 | Chen et al. .................... 438/149 |
| 2008/0157116 A1* | 7/2008 | Park et al. ..................... 257/101 |

FOREIGN PATENT DOCUMENTS

| | | |
|---|---|---|
| KR | 10 2003-0021385 A | 3/2003 |
| KR | 10-2004-0085496 A | 10/2004 |
| KR | 10 2005-0117133 A | 12/2005 |
| KR | 10-2006-0062139 A | 6/2006 |
| KR | 10-2007-0056646 A | 6/2007 |
| KR | 10 2007-0071177 A | 7/2007 |

* cited by examiner

METHOD OF FORMING A POLYCRYSTALLINE SILICON LAYER AND METHOD OF MANUFACTURING THIN FILM TRANSISTOR

BACKGROUND

1. Field

Embodiments relate to a method of forming a polycrystalline silicon layer and a method of manufacturing a thin film transistor (TFT).

2. Description of the Related Art

Thin film transistors (TFTs) are a particular kind of field effect transistor (FET) manufactured by forming a semiconductor thin film on an insulating support substrate. A TFT may include a gate, a drain, and a source. TFTs may be used in, e.g., sensors, memory devices, and optical devices, and may be used as pixel switching devices or operating devices of flat panel displays.

Commercially available LCD products, e.g., notebook PCs, monitors, TVs, or mobile devices, may include an amorphous-silicon TFT (a-Si TFT).

Amorphous-silicon refers to silicon that has an irregular atomic arrangement, unlike that of a crystal, and may have a short range order, e.g., may not have a long range order. An amorphous-silicon may be easily deposited over a large area and may be easily formed on a glass substrate at low temperatures. Due to these features, amorphous-silicon is frequently used in TFTs. However, in active-matrix organic light emitting diode (AMOLED) products, high-performance devices that have an electron mobility rate, e.g., about 0.5 to about 1 $cm^2/Vs$, higher than that of an a-Si TFT, may be required. Thus, a method of manufacturing the high-performance TFTs is desirable.

A polycrystalline silicon TFT (poly-Si TFT) may exhibit a significantly higher performance, compared to an a-Si TFT. An electron mobility rate of a poly-Si TFT may be in the range of a few to several hundred $cm^2/Vs$; and a poly-Si TFT may facilitate mounting of a data operating circuit or peripheral circuit requiring a high electron mobility rate on a substrate. In addition, a channel of a TFT may be small so as to increase an aperture ratio of a screen. In addition, there may be no limitation on an interconnection pitch for connection to an operating circuit along with an increasing pixel number due to the installation of the operating circuit. Thus, high-resolution may be obtained. Also, operating voltage and electric power consumption may be reduced and device characteristics may be far less degraded.

SUMMARY

Embodiments are directed to a method of forming a polycrystalline silicon layer and a method of manufacturing a thin film transistor (TFT).

At least one of the above and other features and advantages may be realized by providing a method of crystallizing a silicon layer, the method including forming a catalyst metal layer on a substrate; forming a catalyst metal capping pattern on the catalyst metal layer; forming a second amorphous silicon layer on the catalyst metal capping pattern; and heat-treating the second amorphous silicon layer to form a polycrystalline silicon layer.

Forming the catalyst metal capping pattern may include forming a first amorphous silicon layer on the catalyst metal layer; and patterning the first amorphous silicon layer.

Forming the catalyst metal capping pattern may further include performing a heat-treatment after patterning the first amorphous silicon layer.

The heat-treatment may be performed at a temperature of about 300 to about 500° C.

Patterning the first amorphous silicon layer may include removing portions of the catalyst metal layer in regions where the catalyst metal capping pattern is not formed.

Forming the catalyst metal layer may include sputtering, atomic layer deposition (ALD), or ion implantation.

The catalyst metal layer may include at least one of nickel (Ni), palladium (Pd), titanium (Ti), silver (Ag), gold (Au), aluminum (Al), tin (Sn), antimony (Sb), copper (Cu), cobalt (Co), molybdenum (Mo), terbium (Tr), ruthenium (Ru), rhodium (Rh), cadmium (Cd), and platinum (Pt).

The catalyst metal layer may have a density of about $10^{11}$ atom/$cm^2$ to about $10^{15}$ atom/$cm^2$.

The method may further include forming a buffer layer between the substrate and the catalyst metal layer.

The buffer layer may include a silicon oxide layer, a silicon nitride layer, or a stack thereof.

Heat-treating the second amorphous silicon layer may include heat-treating the catalyst metal capping pattern and is performed at a temperature of about 600 to about 800° C.

The method may further include forming a polycrystalline silicon layer pattern by etching the polycrystalline silicon layer.

Forming the polycrystalline silicon layer pattern may include removing portions of the polycrystalline silicon layer formed from the catalyst metal capping pattern.

A size of grains and grain boundaries in the polycrystalline silicon layer pattern may be determined by a shape and a position of the catalyst metal capping pattern.

At least one of the above and other features and advantages may also be realized by providing a method of manufacturing a thin film transistor (TFT), the method including forming a buffer layer on a substrate; forming a catalyst metal layer on the buffer layer; forming a catalyst metal capping pattern on the catalyst metal layer; forming a second amorphous silicon layer on the catalyst metal capping pattern; forming a polycrystalline silicon layer by heat-treating the second amorphous silicon layer; forming an activation layer by etching the polycrystalline silicon layer; forming a gate insulating layer on the activation layer pattern; forming a gate electrode on the gate insulating layer; forming source/drain regions at opposite ends of the gate electrode; forming a first interlayer insulating layer on the gate electrode and the gate insulating layer; and forming a source/drain electrode such that the source/drain electrode passes through the first interlayer insulating layer and contacts any one of the source/drain regions.

Forming the catalyst metal capping pattern may include forming a first amorphous silicon layer on the catalyst metal layer; and patterning the first amorphous silicon layer.

Patterning the first amorphous silicon layer may include removing portions of the catalyst metal layer in regions where the catalyst metal capping pattern is not formed.

The catalyst metal layer may include at least one of nickel (Ni), palladium (Pd), titanium (Ti), silver (Ag), gold (Au), aluminum (Al), tin (Sn), antimony (Sb), copper (Cu), cobalt (Co), molybdenum (Mo), terbium (Tr), ruthenium (Ru), rhodium (Rh), cadmium (Cd), and platinum (Pt).

Forming the activation layer by etching the polycrystalline silicon layer may include removing portions of the polycrystalline silicon layer including the catalyst metal capping pattern.

A shape and position of the catalyst metal capping pattern are determined in consideration of a size of grains and grain boundaries in the activation layer pattern.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2010-0057111, filed on Jun. 16, 2010, in the Korean Intellectual Property Office, and entitled: "Method of Forming Polycrystalline Silicon Layer and Method of Manufacturing Thin Film Transistor By Using the Method," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The term grain used herein indicates a crystalline particle constituting polycrystalline silicon. A grain boundary is a boundary between the crystalline particles.

Figure 1:
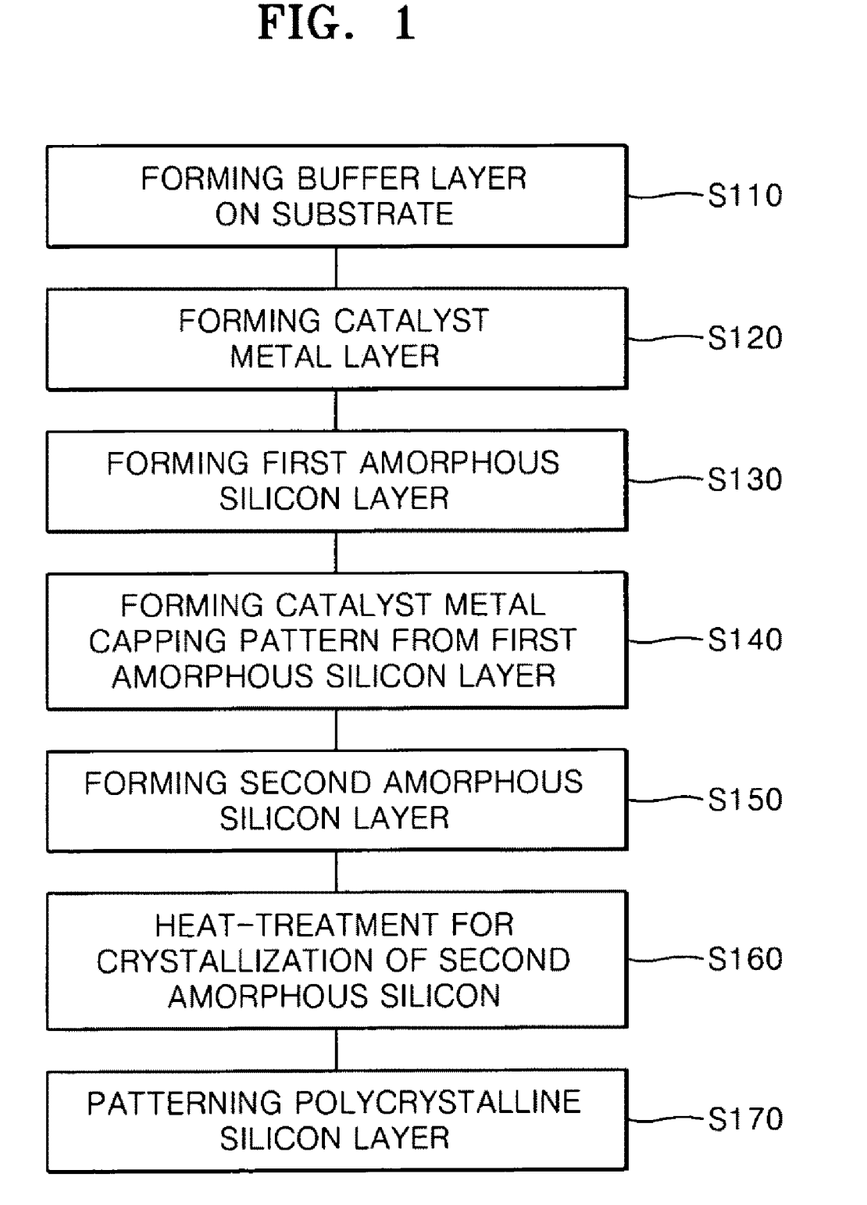
FIG. 1 illustrates a flowchart sequentially explaining a method of forming a polycrystalline silicon layer according to an embodiment.

FIG. 1 illustrates a flowchart sequentially explaining a method of forming a polycrystalline silicon layer according to an embodiment.

Referring to FIG. 1, a buffer layer may be formed on a substrate (Operation S110). The substrate may be formed of, e.g., glass, quartz, or a transparent plastic material. The buffer layer may be formed on the substrate in order to prevent diffusion of moisture or impurities generated from the substrate.

A catalyst metal layer may be formed on the buffer layer (Operation S120). The catalyst metal layer may include a metal, e.g., nickel (Ni), palladium (Pd), titanium (Ti), silver (Ag), gold (Au), aluminum (Al), tin (Sn), antimony (Sb), copper (Cu), cobalt (Co), molybdenum (Mo), terbium (Tr), ruthenium (Ru), rhodium (Rh), cadmium (Cd), or platinum (Pt). The catalyst metal layer may be formed using, e.g., sputtering, atomic layer deposition (ALD), ion implantation, or the like.

A first amorphous silicon layer may be formed on the catalyst metal layer (Operation S130). Then, the first amorphous silicon layer may be patterned to form a catalyst metal capping pattern (Operation S140). During the patterning, portions of the catalyst metal layer under the catalyst metal capping pattern may remain; and portions of the catalyst metal layer on the buffer layer, e.g., on areas where the catalyst metal capping pattern is not formed, may be removed. The catalyst metal capping pattern may be formed of amorphous silicon. Thus, catalyst metal may be diffused from the catalyst metal layer; and the catalyst metal layer may be disposed at a lower portion of the catalyst metal capping pattern.

A second amorphous silicon layer may be formed on the catalyst metal capping pattern and the buffer layer (Operation S150). The second amorphous silicon layer may be formed using the same method used to form the first amorphous silicon layer or any other suitable method.

The second amorphous silicon layer may be crystallized by a heat-treatment (Operation S160). The catalyst metal capping pattern including, e.g., portions of the first amorphous silicon layer, may also be crystallized due to the heat-treatment. The catalyst metal under the catalyst metal capping pattern may become a crystallization seed while the heat-treatment is performed. Accordingly, growth of silicon crystals may be initiated. The silicon may be crystallized in a direction perpendicular to a surface of the substrate; and the catalyst metal capping pattern and the second amorphous silicon layer on the catalyst metal capping pattern may be crystallized. In addition, the silicon may be crystallized in a direction parallel to the surface of the substrate; and the second amorphous silicon layer in regions where the catalyst metal layer has been removed during formation of the catalyst metal capping pattern may be crystallized.

A polycrystalline silicon layer formed by the crystallization of the catalyst metal capping pattern and the second amorphous silicon layer may be patterned (Operation S170). A desired size of grains and a desired position of boundaries of the grains may be obtained in the polycrystalline silicon layer pattern by adjusting a shape and position of the catalyst metal capping pattern. In addition, portions of the polycrystalline silicon layer formed from the catalyst metal capping pattern including the catalyst metal may be removed to, e.g., improve leakage current characteristics.

FIGS. 2A to 2G illustrate cross-sectional views of stages in a method of forming a polycrystalline silicon layer according to an embodiment.

Figure 2A:
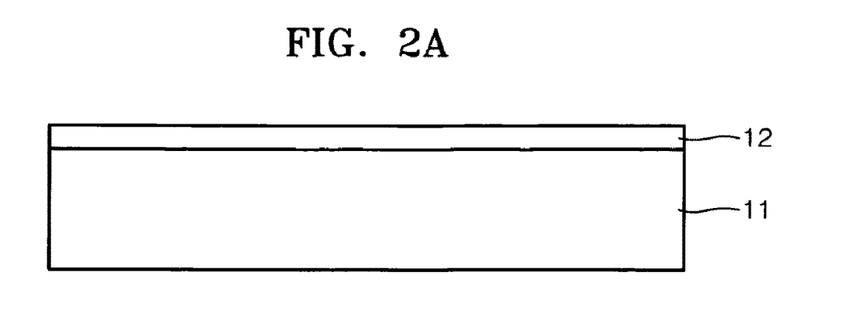
FIGS. 2A to 2G illustrate cross-sectional of stages in a method of forming a polycrystalline silicon layer according to an embodiment.

Referring to FIG. 2A, a buffer layer 12 may be formed on a substrate 11. The substrate 11 may be formed of, e.g., a transparent glass material. However, the substrate 11 is not limited thereto, and may also be formed of, e.g., quartz or a transparent plastic material. A plastic substrate may be formed of, e.g., an insulating organic material.

The buffer layer 12 may be formed on the substrate 11 in order to prevent diffusion of moisture or impurities generated from the substrate 11. The buffer layer 12 may be formed of, e.g., a silicon oxide ($SiO_2$) layer, a silicon nitride ($SiN_x$) layer, or a stack thereof.

Figure 2B:
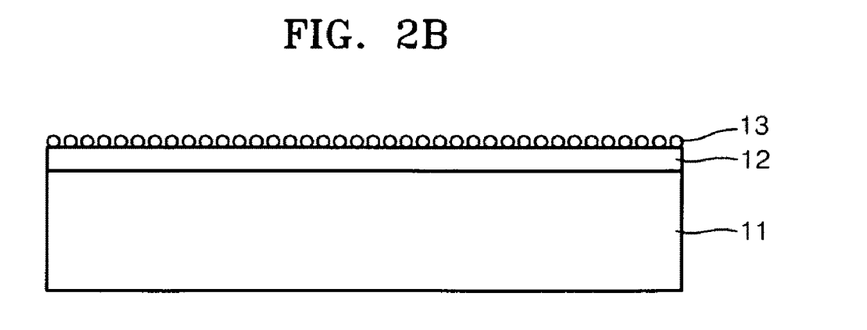

Referring to FIG. 2B, a catalyst metal layer 13 may be formed on the buffer layer 12. The catalyst metal layer 13 may include a metal, e.g., nickel (Ni), palladium (Pd), titanium (Ti), silver (Ag), gold (Au), aluminum (Al), tin (Sn), antimony (Sb), copper (Cu), cobalt (Co), molybdenum (Mo), terbium (Tr), ruthenium (Ru), rhodium (Rh), cadmium (Cd), and/or platinum (Pt). The catalyst metal layer 13 may be formed by, e.g., sputtering, atomic layer deposition (ALD), or ion implantation. The catalyst metal layer 13 formed by ion implantation may be heat-treated. The heat-treatment may be performed at about 400° C.

As shown in FIG. 2B, in the catalyst metal layer 13, catalyst metal may not be continuously disposed. For example, the catalyst metal may be formed at a density less than that of a monolayer. In an implementation, the catalyst metal layer 13 may have a density of about $10^{11}$ atom/$cm^2$ to about $10^{15}$ atom/$cm^2$. Maintaining the density of the catalyst metal at about $10^{11}$ atom/$cm^2$ or greater may help ensure that the catalyst metal layer 13 has a uniform density and sufficient reliability. Maintaining the density of the catalyst metal at about $10^{15}$ atom/$cm^2$ or less may help ensure that a size of crystals of growing polycrystalline silicon is not reduced and that the catalyst metal is not diffused and thus may not be present in a resultant polycrystalline silicon layer pattern, thereby avoiding undesirable leakage current.

Figure 2C:
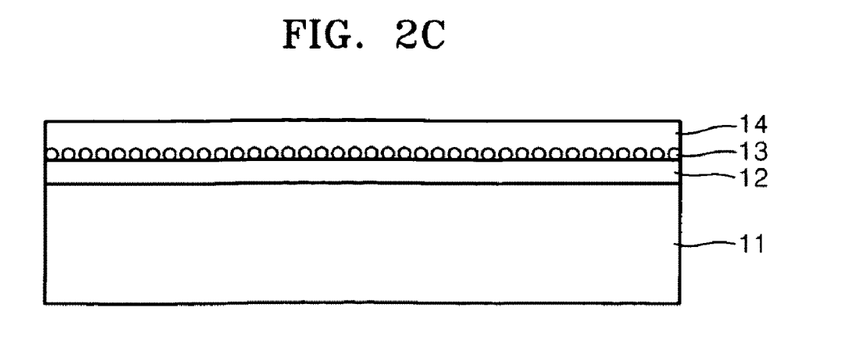

Referring to FIG. 2C, a first amorphous silicon layer 14 may be formed on the catalyst metal layer 13. The first amorphous silicon layer 14 may be formed by using various suitable methods. For example, the first amorphous silicon layer 14 may be formed by plasma enhanced chemical vapor deposition (PECVD) or low pressure chemical vapor deposition (LPCVD).

Figure 2D:
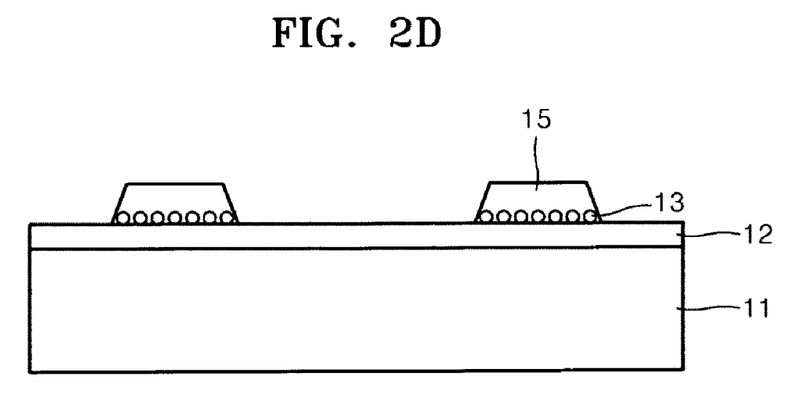

Referring to FIG. 2D, a catalyst metal capping pattern 15 may be formed by patterning the first amorphous silicon layer 14. Portions of the catalyst metal layer 13 under the catalyst metal capping pattern 15 may remain on the substrate 11; and portions of the catalyst metal layer 13, e.g., where the buffer layer 12 is exposed or where the catalyst metal capping pattern 15 is not formed, may be removed when the first amorphous silicon layer 14 is patterned. After forming the catalyst metal capping pattern 15, a heat-treatment may be performed at about 400° C.

Figure 2E:
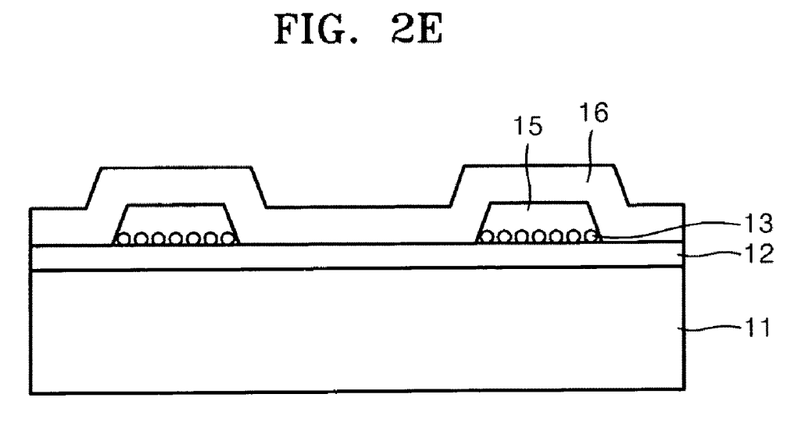

Referring to FIG. 2E, a second amorphous silicon layer 16 may be formed on the catalyst metal capping pattern 15 and the buffer layer 12. The second amorphous silicon layer 16 may be formed using the same method used to form the first amorphous silicon layer, e.g., PECVD or LPCVD.

Figure 2F:
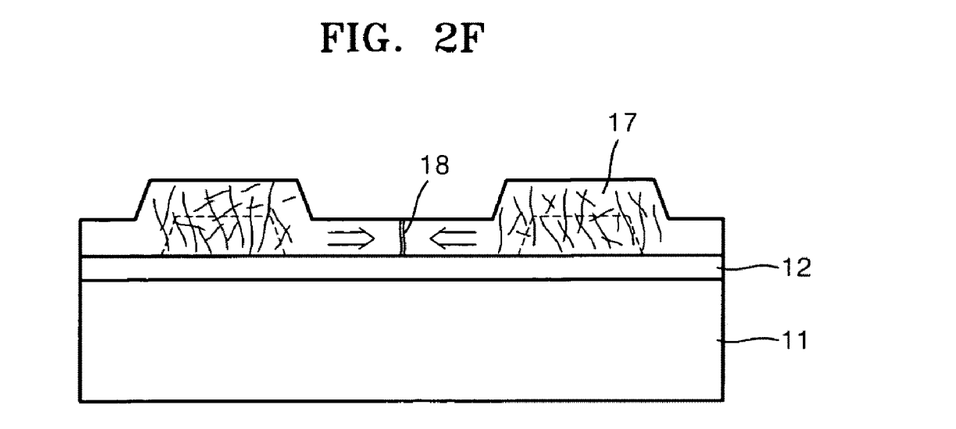

Referring to FIG. 2F, the catalyst metal capping pattern 15 and the second amorphous silicon layer 16 may be crystallized by a heat-treatment to form a polycrystalline silicon layer 17. For example, the heat-treatment may be performed by using rapid thermal annealing (RTA) at about 700° C.

The metal of the catalyst metal layer 13 under the catalyst metal capping pattern 15 may become a crystallization seed due to the heat-treatment and may initiate silicon crystal growth. As a result of the crystallization of silicon in a direction perpendicular to a surface of the substrate, the catalyst metal capping pattern 15 and portions of the second amorphous silicon layer 16 on the catalyst metal capping pattern 15 may be crystallized. In addition, as a result of the crystallization of silicon in a direction parallel to the surface of the substrate, portions of the second amorphous silicon layer 16, e.g., on the substrate 11 where the catalyst metal capping pattern 15 was not formed, may also be crystallized, as shown by an arrow in FIG. 2F.

As shown in FIG. 2F, silicon crystals that grow in the catalyst metal capping pattern 15 and portions of the second amorphous silicon layer 16 on the catalyst metal capping pattern 15 may have a small grain size and a large number of grain boundaries. Silicon crystals that grow in portions of the second amorphous silicon layer 16 on the substrate 11 where the catalyst metal capping pattern 15 is not formed may have a large grain size and a few grain boundaries. A grain boundary 18 may be formed at a position where silicon crystals that grow away from catalyst metals under the separate catalyst metal capping patterns 15 meet. Accordingly, a position of the grain boundary 18 and the size of the grains may be controlled by adjusting a position and shape of the catalyst metal capping pattern 15.

Figure 2G:
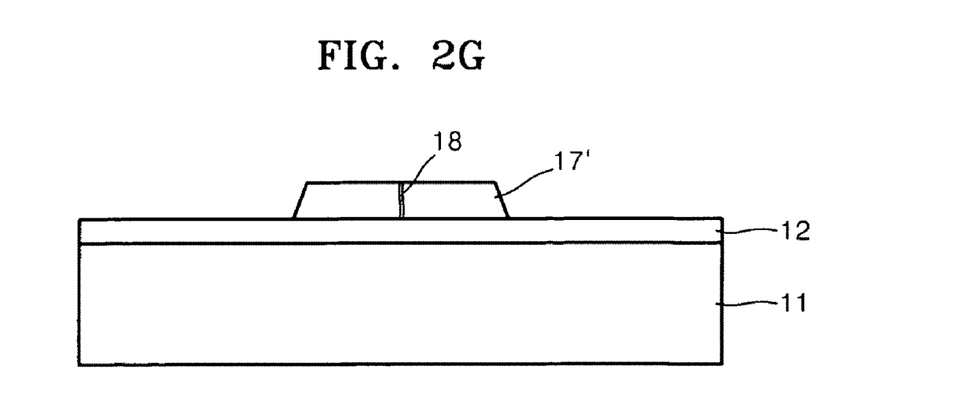

Referring to FIG. 2G, the polycrystalline silicon layer 17 may be patterned to obtain a desired polycrystalline silicon layer pattern 17'. During patterning of the polycrystalline silicon layer 17, polycrystalline silicon that grew from the catalyst metal capping pattern 15 and portions of the second amorphous silicon layer 16 on the catalyst metal capping pattern 15 may be removed. As shown in FIG. 2F, crystals that grow from adjacent catalyst metals may meet each other in the polycrystalline silicon of the catalyst metal capping pattern 15. Thus, the size of crystals may be limited and a number of grain boundaries may be formed. There may be little or no catalyst metal in the polycrystalline silicon that grows away from the catalyst metal capping pattern 15 in a direction parallel to the surface of the substrate, so that the size of crystals may increase and the number of the grain boundary may be reduced. Accordingly, undesirable leakage current caused by the small grain size and the grain boundaries may be prevented by removing polycrystalline silicon that grows from the catalyst metal capping pattern 15 and portions of the second amorphous silicon layer 16 on the catalyst metal capping pattern 15. In addition, the catalyst metal in the catalyst metal capping pattern 15 may also be removed by removing the polycrystalline silicon that grows from the catalyst metal capping pattern 15 and portions of the second amorphous silicon layer 16 on the catalyst metal capping pattern 15. Thus, the polycrystalline silicon layer pattern 17' may not contain catalyst metal, thereby improving leakage current characteristics.

The polycrystalline silicon layer pattern 17' according to the present embodiment may include the grain boundary 18. However, in an implementation, the shape and position of the catalyst metal capping pattern 15 may be changed such that the polycrystalline silicon layer pattern 17' does not contain the grain boundary 18.

Figure 3:
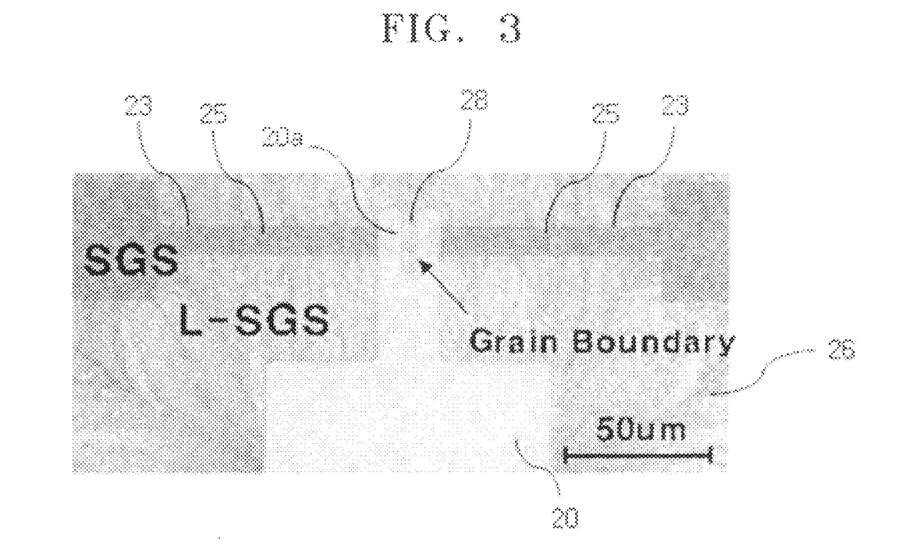
FIGS. 3 and 4 illustrate optical microscope images of a top view of a polycrystalline silicon layer according to an embodiment.
Figure 4:
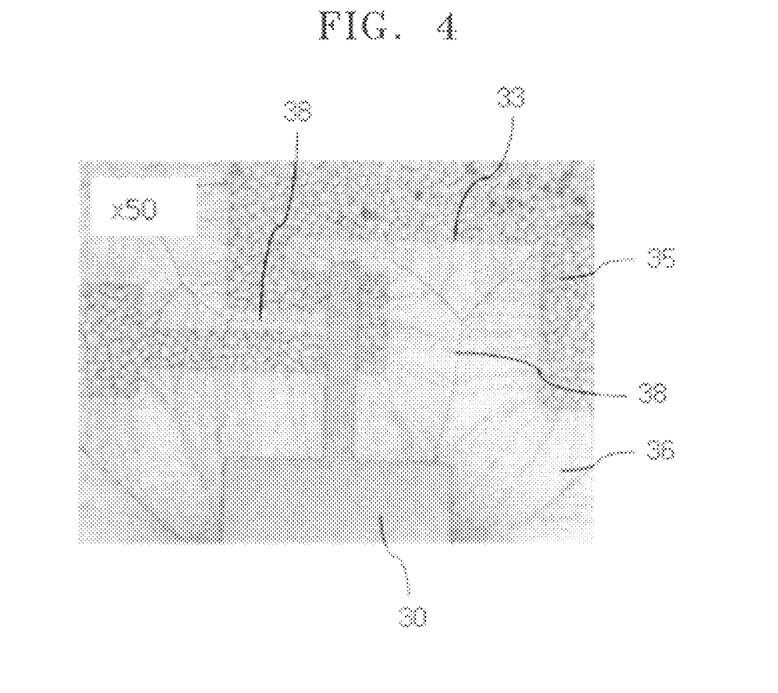

FIGS. 3 and 4 illustrate optical microscope images of a top view of a polycrystalline silicon layer according to an embodiment. FIGS. 3 and 4 show polycrystalline silicon layers 25 and 35 formed from catalyst metal capping patterns 23 and 33 and polycrystalline silicon layers 26 and 36 formed from other regions, e.g., regions where the catalyst metal capping pattern 23 and 33 was not formed. Test patterns 20 and 30 are references used to measure positions of grain boundaries 28 and 38 of the polycrystalline silicon layer.

Referring to FIG. 3, the polycrystalline silicon layer 25 formed from the catalyst metal capping pattern 23 may have small crystals that are densely formed; and the polycrystalline silicon layer 26 formed from the other regions may have large crystals. The grain boundary 28 may be formed in a recession 20a of the test pattern 20 by the catalyst metal capping patterns 23 that are symmetrically spaced apart from each other.

The small grain size of the polycrystalline silicon layer 25 formed from the catalyst metal capping pattern 23 may be caused by catalyst metals included therein. The catalyst metals that are crystallization seeds may be close to each other. Thus, crystals growing from the crystallization seeds may meet each other and thus have small grain sizes. The polycrystalline silicon layer 26 formed from regions other than the catalyst metal capping pattern 23 may not include the crystallization seeds. Thus, crystals may have relatively large grain sizes.

The catalyst metal capping patterns 23 may be formed to be symmetrical with respect to the recession 20a of the test pattern 20. Thus, the grain boundary 28 may be formed in the recession 20a of the test pattern 20. For example, silicon crystals that grow from the catalyst metal capping patterns 23 may meet each other in the recession 20a of the test pattern 20, and thus the grain boundary 28 may be formed.

Referring to FIG. 4, the polycrystalline silicon layer 35 formed from the catalyst metal capping pattern 33 may have small crystals that are densely formed; and the polycrystalline silicon layer 36 formed from the other regions, e.g., regions where the catalyst metal capping pattern 33 were not formed, may have relatively large crystals.

The catalyst metal capping pattern 33 shown in FIG. 4 may have a shape different from that of the catalyst metal capping pattern 23 shown in FIG. 3. Thus, the grain boundary 38 of the polycrystalline silicon layer 36 may be formed in a position with respect to the test pattern 30, which is different from that shown in FIG. 3. Referring to FIG. 4, the grain boundary 38 may be formed between the catalyst metal capping patterns 33. Thus, the position of the grain boundary 38 may be adjusted by adjusting the position of the catalyst metal capping patterns 33.

Example

A buffer layer including a silicon oxide layer (3000 Å)/silicon nitride layer (300 Å) was formed on a glass substrate. A Ni layer was formed on the buffer layer using ALD and heat-treated at 400° C. for 10 minutes. Then, a first amorphous silicon layer was formed on the Ni layer to a thickness of 200 Å and patterned by etching to form a catalyst metal capping pattern. Portions of the Ni layer under portions of the first amorphous silicon layer that were etched were also removed. After forming the catalyst metal capping pattern, a heat-treatment was performed at 400° C. for 10 minutes. A second amorphous silicon layer was formed on the catalyst metal capping pattern and the exposed buffer layer to a thickness of 650 Å. Then, the catalyst metal capping pattern and the second amorphous silicon layer were crystallized by a heat-treatment at 700° C. for 20 minutes to form a polycrystalline silicon layer. Then, the polycrystalline silicon layer was patterned to form an activation layer. A gate insulating layer and a gate electrode were formed on the activation layer. Source and drain electrodes electrically connected to the activation layer were then formed.

Comparative Example

A buffer layer including a silicon oxide layer (3000 Å)/silicon nitride layer (300 Å) was formed on a glass substrate. A Ni layer was formed on the buffer layer using ALD and heat-treated at 400° C. for 10 minutes. An amorphous silicon layer was formed on the Ni layer to a thickness of 650 Å. Then, the amorphous silicon layer was crystallized by a heat-treatment at 700° C. for 20 minutes to form a polycrystalline silicon layer. Then, the polycrystalline silicon layer was patterned to form an activation layer. A gate insulating layer and a gate electrode were formed on the activation layer. Source and drain electrodes electrically connected to the activation layer were then formed.

Evaluation

Figure 5:
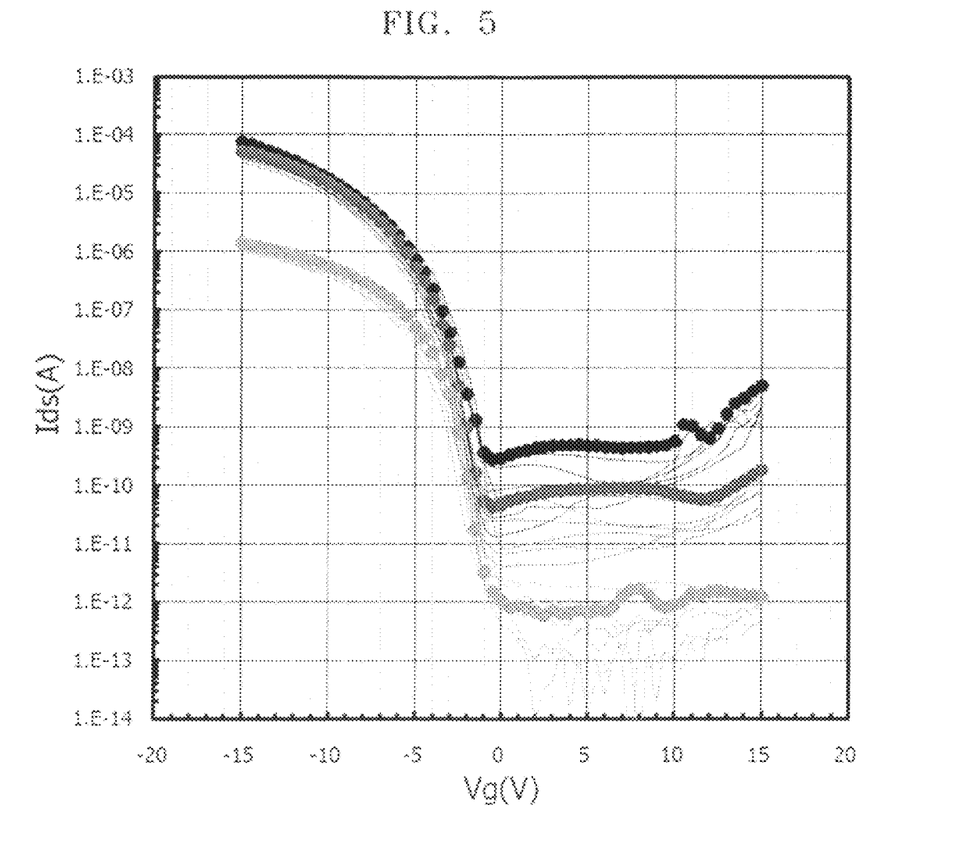
FIG. 5 illustrates a graph showing gate voltages with respect to drain currents of a thin film transistor (TFT) including a polycrystalline silicon activation layer prepared according to a Comparative Example.
Figure 6:
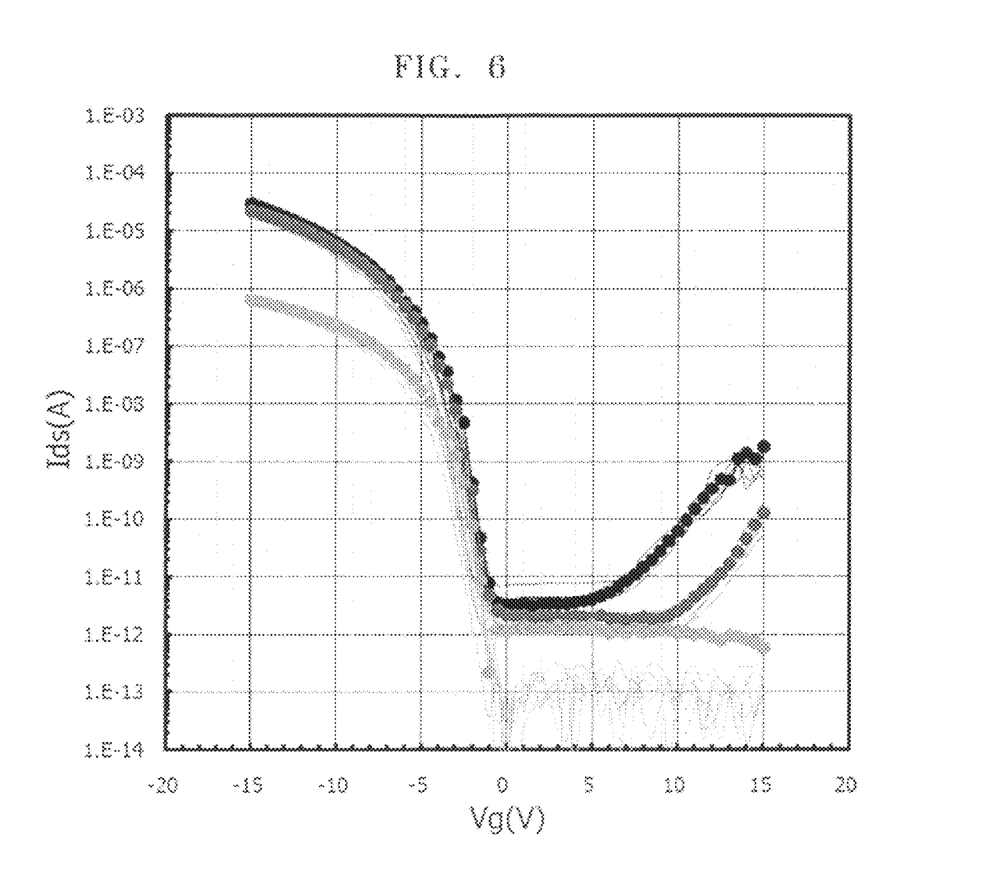
FIG. 6 illustrates a graph showing gate voltages with respect to drain currents of a TFT including a polycrystalline silicon activation layer according to an Example.

FIG. 5 illustrates a graph showing gate voltages with respect to drain currents of a thin film transistor (TFT) including a polycrystalline silicon activation layer prepared in the Comparative Example. FIG. 6 illustrates a graph showing gate voltages with respect to drain currents of a TFT including a polycrystalline silicon activation layer according to the Example. PMOS TFTs were manufactured in the Comparative Example and the Example.

While an off current of the TFT prepared according to the Comparative Example was in the range of $10^{-13}$ to $10^{-9}$ A in the graph of FIG. 5, an off current of the TFT prepared according to the Example was in the range of $10^{-13}$ to $10^{-11}$ A in the graph of FIG. 6. For example, the off current range of the TFT prepared according to the Example was two orders of magnitude, which was less than the off current range (four orders of magnitude) of the TFT prepared according to the Comparative Example by two orders of magnitude. As a result, it may be seen that a distribution of the off current according to the Example was more uniform than that of the Comparative Example. In addition, a maximum off current according to the Example was $10^{-11}$ A, which was less than the maximum off current ($10^{-9}$ A) according to the Comparative Example. Thus, the TFT according to the Example exhibited better off current characteristics than that of the Comparative Example.

According to the Example, the grain boundary was formed at a center of a channel region of the activation layer perpendicular to current flow. Thus, drain current was inhibited. For example, the on current was reduced. In an implementation, if the position of the catalyst metal capping pattern is adjusted such that the grain boundary is not formed in the channel region when the polycrystalline silicon layer is formed, the on current may increase and the off current may be further reduced.

FIGS. 7A to 7D illustrate cross-sectional views of stages in a method of manufacturing a TFT by using a polycrystalline silicon layer formed according to an embodiment.

Figure 7A:
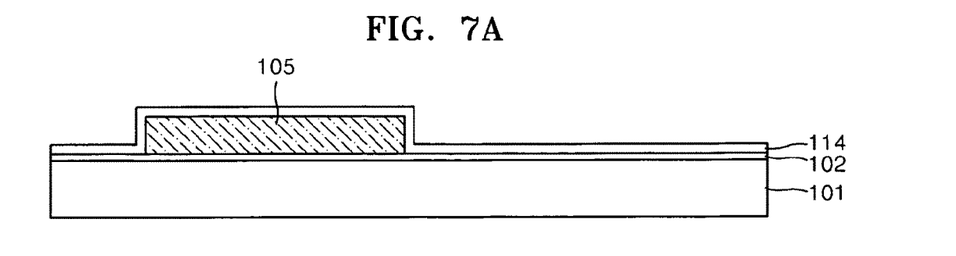
FIGS. 7A to 7D illustrate cross-sectional views of stages in a method of manufacturing a TFT by using a polycrystalline silicon layer formed according to an embodiment.

Referring to FIG. 7A, a polycrystalline silicon layer (not illustrated) may be formed on a substrate 101 on which a buffer layer 102 is formed and may be patterned to form an activation layer 105. In the activation layer 105, a grain size and position of a grain boundary may be controlled. In addition, the activation layer 105 may not include the catalyst metal, e.g., traces of the catalyst metal may not remain in the activation layer 105. Thus, leakage current characteristics of the TFT may be improved.

Figure 7B:
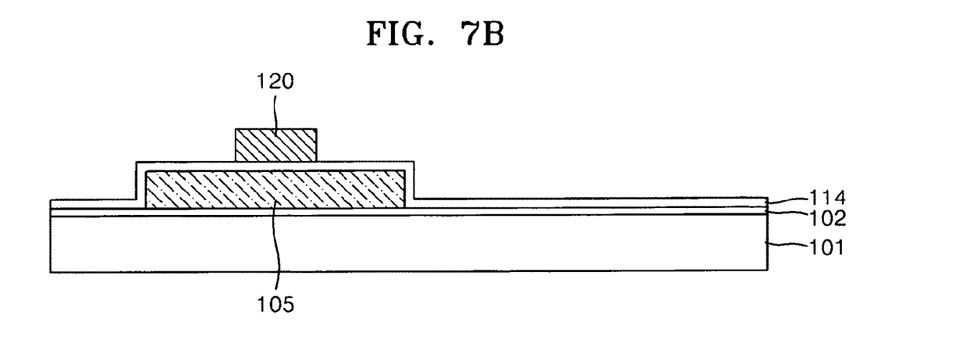

Referring to FIG. 7B, a gate insulating layer 114 may be formed on the activation layer 105; and a conductive layer (not illustrated) may be formed on the gate insulating layer 114 and then patterned to form a gate electrode 120. The gate insulating layer 114 may include an insulating layer, e.g., a silicon oxide layer or a silicon nitride layer. The gate electrode 120 may include, e.g., gold (Au), silver (Ag), copper (Cu), nickel (Ni), platinum (Pt), palladium (Pd), aluminum (Al), molybdenum (Mo), tungsten (W), titanium (Ti), or an alloy thereof.

Figure 7C:
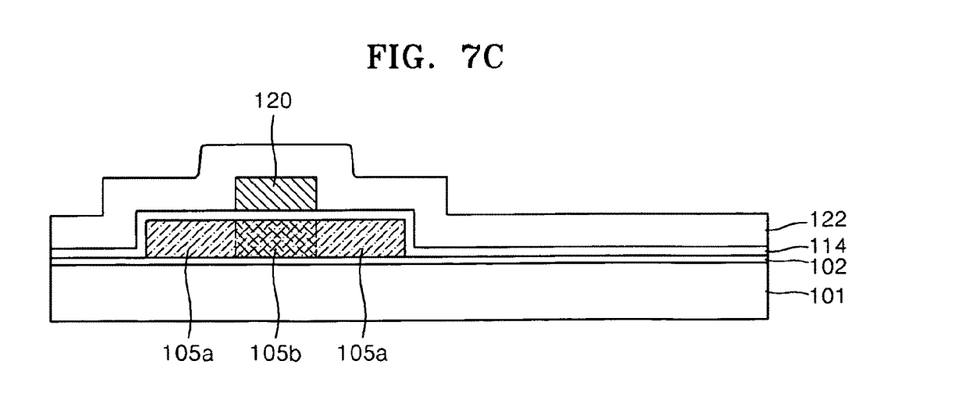

Referring to FIG. 7C, source/drain regions 105a may be formed at opposite ends of the activation layer 105; and a first interlayer insulating layer 122 may be formed on the resultant structure. A channel region 105b may be formed in a portion of the activation layer 105 between the source/drain regions 105a. The source/drain regions 105a may be formed by a self-alignment method including ion-doping using the gate electrode 120 as a mask. The first interlayer insulating layer 122 may be a single insulating layer, e.g., a silicon oxide layer or a silicon nitride layer, or may include a plurality of the insulating layers.

Figure 7D:
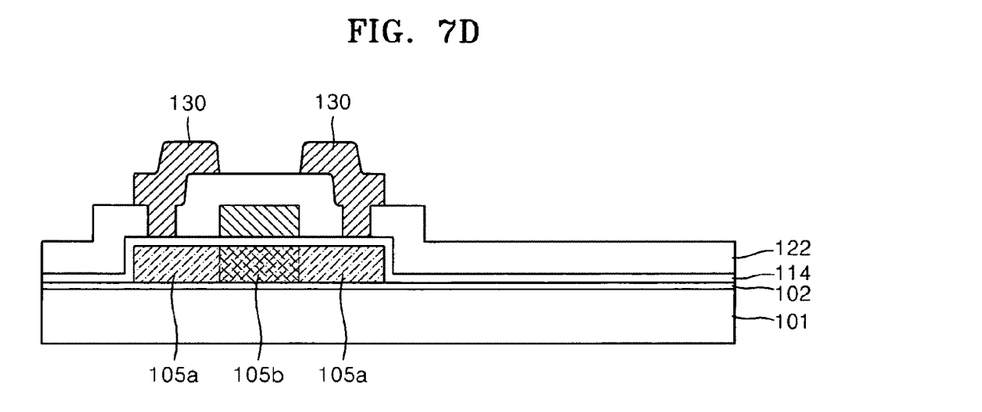

Referring to FIG. 7D, source/drain electrodes 130 contacting the source/drain regions 105a may be formed in the first interlayer insulating layer 122. The source/drain electrodes 130 may be formed by forming holes exposing an upper surface of the source/drain regions 105a in the first interlayer insulating layer 122, followed by filling the holes with a conduction layer and patterning the conduction layer. The conduction layer may include, e.g., gold (Au), silver (Ag), copper (Cu), nickel (Ni), platinum (Pt), palladium (Pd), aluminum (Al), molybdenum (Mo), tungsten (W), titanium (Ti), or an alloy thereof.

Figure 8:
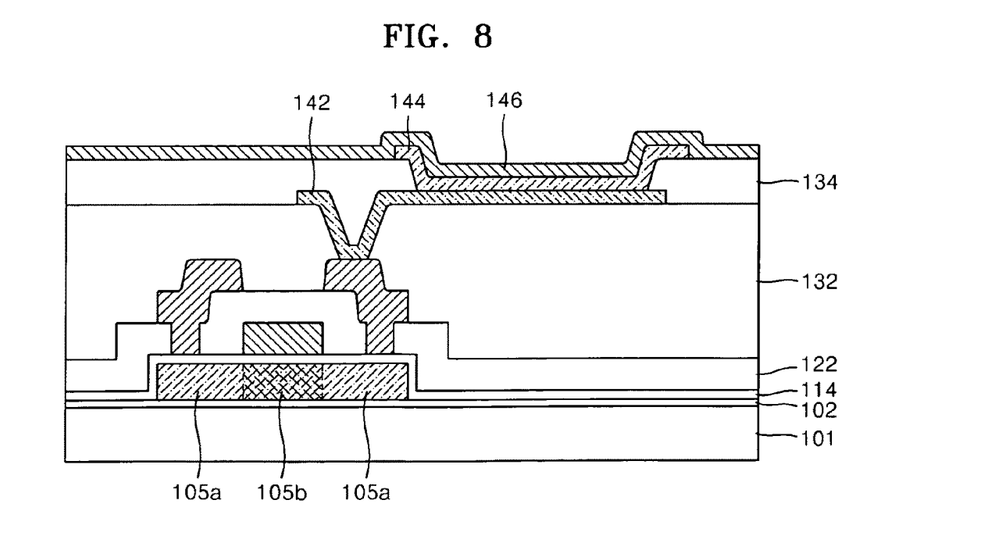
FIG. 8 illustrates a cross-sectional view of an organic light emitting diode (OLED) according to an embodiment.

FIG. 8 illustrates a cross-sectional view of an organic light emitting diode (OLED) according to an embodiment.

Referring to FIG. 8, the OLED according to the present embodiment may include a TFT manufactured using the method described with reference to FIGS. 7A to 7D. A second insulating layer 132 may be formed on the TFT. The second insulating layer 132 may include, e.g., an organic layer or an inorganic layer.

In a pixel unit, a first electrode 142 may pass through the second interlayer insulating layer 132 and may contact any one of the source/drain electrodes 130. In addition, the first electrode 142 may extend onto the second interlayer insulating layer 132. The first electrode 142 may be a transparent conductive oxide layer including, e.g., indium tin oxide (ITO) or indium zinc oxide (IZO).

An organic layer 144 may contact a portion of the first electrode 142 exposed by a pixel defining layer 134 on the second interlayer insulating layer 132. The pixel defining layer 134 may include, e.g., an organic layer or an inorganic layer. The organic layer 144 may include an emission layer and at least one of a hole injection layer, a hole transport layer, an electron transport layer, and an electron injection layer. A second electrode 146 may be formed on the organic layer 144. The second electrode 146 may be formed of metal, e.g., magnesium (Mg), silver (Ag), aluminum (Al), calcium (Ca), or an alloy thereof.

By way of review, methods of forming polycrystalline silicon may be categorized into a low temperature process and a high temperature process, according to a process temperature. In regard to a high temperature process, an expensive quartz substrate with a high thermal resistance may be required, instead of a glass substrate, because the process temperature may be equal to or higher than a temperature at which an insulating substrate is deformed. In addition, a polycrystalline silicon layer formed by using the high temperature process may have low quality crystallinity, e.g., high surface roughness or micro grains.

In regard to a low temperature process, amorphous silicon deposited at a low temperature may be crystallized into polycrystalline silicon. As a low temperature crystallization technique, an excimer laser crystallization (ELC) technique and a crystallization technique using a metal as a catalyst have been researched. In the ELC technique, melting and solidification of amorphous silicon may be repeatedly performed by irradiating a pulse-type laser beam onto a substrate in units of nano seconds. The laser crystallization technique, however, may be expensive, time-consuming, and inefficient.

Metal induced crystallization (MIC) and metal induced lateral crystallization (MILC) are methods of crystallizing silicon using a metal as a catalyst.

In the MIC, a catalyst metal may be deposited on amorphous silicon and crystallized at a high temperature. Accordingly, small linear polycrystalline silicon may grow randomly. In the MILC, a catalyst metal may be arranged in a line on amorphous silicon by using a mask and then deposited, thereby growing polycrystalline silicon in one direction. However, a large amount of catalyst metal is used in both the MIC and MILC. Thus metal remaining in a polycrystalline silicon layer may cause an undesirable leakage current.

The embodiments provide a method of forming a polycrystalline silicon layer in which a position and number of grain boundaries may be controlled and in which catalyst metal may not remain.

The embodiments also provide a method of manufacturing a thin film transistor in which leakage current and a distribution of the leakage current may be controlled by controlling the position and number of grain boundaries and preventing a catalyst metal from remaining in polycrystalline silicon.

A polycrystalline silicon layer having a desired grain size and desired position of a grain boundary may be formed by controlling a shape and position of the catalyst metal capping pattern. In addition, by removing the catalyst metal capping pattern in which the catalyst metal remains, leakage current characteristics may be improved.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of crystallizing a silicon layer, the method comprising:
   forming a catalyst metal layer on a substrate;
   forming a catalyst metal capping pattern directly on the catalyst metal layer such that the catalyst metal capping pattern includes amorphous silicon;
   forming a second amorphous silicon layer on the catalyst metal capping pattern; and
   heat-treating the second amorphous silicon layer to form a polycrystalline silicon layer.

2. The method as claimed in claim 1, wherein forming the catalyst metal capping pattern includes:
   forming a first amorphous silicon layer directly on the catalyst metal layer; and
   patterning the first amorphous silicon layer.

3. The method as claimed in claim 2, wherein forming the catalyst metal capping pattern further includes performing a heat-treatment after patterning the first amorphous silicon layer.

4. The method as claimed in claim 3, wherein the heat-treatment is performed at a temperature of about 300 to about 500° C.

5. The method as claimed in claim 2, wherein patterning the first amorphous silicon layer includes removing portions of the catalyst metal layer in regions where the catalyst metal capping pattern is not formed.

6. The method as claimed in claim 1, wherein forming the catalyst metal layer includes sputtering, atomic layer deposition (ALD), or ion implantation.

7. The method as claimed in claim 1, wherein the catalyst metal layer includes at least one of nickel (Ni), palladium (Pd), titanium (Ti), silver (Ag), gold (Au), aluminum (Al), tin (Sn), antimony (Sb), copper (Cu), cobalt (Co), molybdenum (Mo), terbium (Tr), ruthenium (Ru), rhodium (Rh), cadmium (Cd), and platinum (Pt).

8. The method as claimed in claim 1, wherein the catalyst metal layer has a density of about $10^{11}$ atom/cm$^2$ to about $10^{15}$ atom/cm$^2$.

9. The method as claimed in claim 1, further comprising forming a buffer layer between the substrate and the catalyst metal layer.

10. The method as claimed in claim 9, wherein the buffer layer includes a silicon oxide layer, a silicon nitride layer, or a stack thereof.

11. The method as claimed in claim 1, wherein heat-treating the second amorphous silicon layer includes heat-treating the catalyst metal capping pattern and is performed at a temperature of about 600 to about 800° C.

12. The method as claimed in claim 1, further comprising forming a polycrystalline silicon layer pattern by etching the polycrystalline silicon layer.

13. The method as claimed in claim 12, wherein forming the polycrystalline silicon layer pattern includes:
removing the catalyst metal capping pattern and the catalyst metal layer, and
removing portions of the polycrystalline silicon layer formed on the catalyst metal capping pattern such that portions of the polycrystalline silicon formed between the catalyst metal capping pattern remain on the substrate.

14. The method as claimed in claim 13, wherein a size of grains and grain boundaries in the polycrystalline silicon layer pattern are determined by a shape and a position of the catalyst metal capping pattern prior to removing the catalyst metal capping pattern.

15. A method of manufacturing a thin film transistor (TFT), the method comprising:
forming a buffer layer on a substrate;
forming a catalyst metal layer on the buffer layer;
forming a catalyst metal capping pattern directly on the catalyst metal layer such that the catalyst metal capping pattern includes amorphous silicon;
forming a second amorphous silicon layer on the catalyst metal capping pattern;
forming a polycrystalline silicon layer by heat-treating the second amorphous silicon layer;
forming an activation layer by etching the polycrystalline silicon layer;
forming a gate insulating layer on the activation layer pattern;
forming a gate electrode on the gate insulating layer;
forming source/drain regions at opposite ends of the gate electrode;
forming a first interlayer insulating layer on the gate electrode and the gate insulating layer; and
forming a source/drain electrode such that the source/drain electrode passes through the first interlayer insulating layer and contacts any one of the source/drain regions.

16. The method as claimed in claim 15, wherein forming the catalyst metal capping pattern includes:
forming a first amorphous silicon layer directly on the catalyst metal layer; and
patterning the first amorphous silicon layer.

17. The method as claimed in claim 15, wherein patterning the first amorphous silicon layer includes removing portions of the catalyst metal layer in regions where the catalyst metal capping pattern is not formed.

18. The method as claimed in claim 15, wherein the catalyst metal layer includes at least one of nickel (Ni), palladium (Pd), titanium (Ti), silver (Ag), gold (Au), aluminum (Al), tin (Sn), antimony (Sb), copper (Cu), cobalt (Co), molybdenum (Mo), terbium (Tr), ruthenium (Ru), rhodium (Rh), cadmium (Cd), and platinum (Pt).

19. The method as claimed in claim 15, wherein forming the activation layer by etching the polycrystalline silicon layer includes removing portions of the polycrystalline silicon layer including the catalyst metal capping pattern.

20. The method as claimed in claim 15, wherein a shape and position of the catalyst metal capping pattern are determined in consideration of a size of grains and grain boundaries in the activation layer pattern.

* * * * *